(12) United States Patent
Bathan et al.

(10) Patent No.: US 8,802,505 B2
(45) Date of Patent: Aug. 12, 2014

(54) SEMICONDUCTOR DEVICE AND METHOD OF FORMING A PROTECTIVE LAYER ON A BACKSIDE OF THE WAFER

(75) Inventors: Henry D. Bathan, Singapore (SG); Zigmund R. Camacho, Signapore (SG); Jairus L. Pisigan, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 470 days.

(21) Appl. No.: 12/242,011

(22) Filed: Sep. 30, 2008

(65) Prior Publication Data

US 2010/0078834 A1    Apr. 1, 2010

(51) Int. Cl.
   *H01L 21/44* (2006.01)

(52) U.S. Cl.
   USPC ........... 438/127; 438/125; 438/126; 257/701; 257/706; 257/787

(58) Field of Classification Search
   USPC ........................................ 438/106
   See application file for complete search history.

(56) References Cited

U.S. PATENT DOCUMENTS

| | | | |
|---|---|---|---|
| 5,450,283 A * | 9/1995 | Lin et al. | 361/704 |
| 5,817,545 A * | 10/1998 | Wang et al. | 438/127 |
| 6,023,094 A * | 2/2000 | Kao et al. | 257/632 |
| 6,117,797 A * | 9/2000 | Hembree | 438/759 |
| 6,657,297 B1 * | 12/2003 | Jewram et al. | 257/720 |
| 6,835,592 B2 * | 12/2004 | Hall et al. | 438/106 |
| 2003/0109082 A1 * | 6/2003 | Koduri et al. | 438/125 |
| 2003/0218237 A1 * | 11/2003 | Hall et al. | 257/675 |
| 2005/0145328 A1 * | 7/2005 | Lim et al. | 156/247 |
| 2008/0057662 A1 * | 3/2008 | Blalock et al. | 438/387 |

* cited by examiner

*Primary Examiner* — Colleen Matthews
*Assistant Examiner* — William Harriston
(74) *Attorney, Agent, or Firm* — Robert D. Atkins; Patent Law Group: Atkins and Associates, P.C.

(57) ABSTRACT

A semiconductor device is made by forming solder bumps on a first side of a semiconductor wafer. A protective layer is formed on a second side of the semiconductor wafer opposite the first side. The protective layer can be adhesive paste, laminated film, spin-coated resin, epoxy based elastomer, organic rubbery material, polystyrene, polyethylene terephthalate, or other polymer material. The semiconductor wafer is singulated into semiconductor die. The semiconductor die is mounted to a carrier. A molding compound is formed around the semiconductor die. The protective layer provides stress relief for the semiconductor die. The protective layer is removed from the semiconductor die. The protective layer can provide a thermal dissipation, in which case it is made with metal or polymer-based material with a filler such as alumina, zinc oxide, silicon dioxide, silver, aluminum, and aluminum nitride.

33 Claims, 5 Drawing Sheets

SEMICONDUCTOR DEVICE AND METHOD OF FORMING A PROTECTIVE LAYER ON A BACKSIDE OF THE WAFER

FIELD OF THE INVENTION

The present invention relates in general to semiconductor devices and, more particularly, to a semiconductor device having a protective layer formed on a backside of the wafer to provide stress relief and thermal conductivity.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In the back-end molding process, the semiconductor die is sealed with an encapsulant for protection from external elements and contaminants. The die is placed in a mold injection cavity or chamber to form the encapsulant around the die. The molding process necessarily involves application of pressure to force the encapsulant material around the die. However, the backside of the die is often subjected to stress as it is pressed against internal surfaces in the molding cavity. The stress can cause die cracking and solder bump damage.

In addition, semiconductor devices inherently generate heat during normal operation. Excessive heat build-up can adversely affect the operation of the device and shorten its longevity. Heat sinks have been used for thermal dissipation. However, conventional heat sinks require dedicated structures to form the thermal conduction path to dissipate the heat. These thermal conduction structures add to the cost and size of the semiconductor package.

SUMMARY OF THE INVENTION

A need exists to dissipate heat from a semiconductor device. Accordingly, in one embodiment, the present invention is a method of making a semiconductor device comprising the steps of providing a semiconductor wafer, forming solder bumps on a first side of the semiconductor wafer, forming a protective layer on a second side of the semiconductor wafer opposite the first side, singulating the semiconductor wafer into semiconductor die, mounting the semiconductor die to a carrier, and forming molding compound around the semiconductor die. The protective layer provides stress relief for the semiconductor die.

In another embodiment, the present invention is a method of making a semiconductor device comprising the steps of providing a semiconductor wafer, forming an interconnect structure on a first side of the semiconductor wafer, forming a protective layer on a second side of the semiconductor wafer opposite the first side, singulating the semiconductor wafer into semiconductor die, and forming molding compound around the semiconductor die. The protective layer provides stress relief for the semiconductor die.

In another embodiment, the present invention is a method of making a semiconductor device comprising the steps of providing a semiconductor wafer, forming an interconnect structure on a first side of the semiconductor wafer, forming a protective layer on a second side of the semiconductor wafer opposite the first side, singulating the semiconductor wafer into semiconductor die, and forming molding compound around the semiconductor die.

In another embodiment, the present invention is a semiconductor device comprising a semiconductor die and interconnect structure on a first side of the semiconductor die. A protective layer is formed on a second side of the semiconductor wafer opposite the first side. A molding compound is formed around the semiconductor die.

DETAILED DESCRIPTION OF THE DRAWINGS

Figure 1:
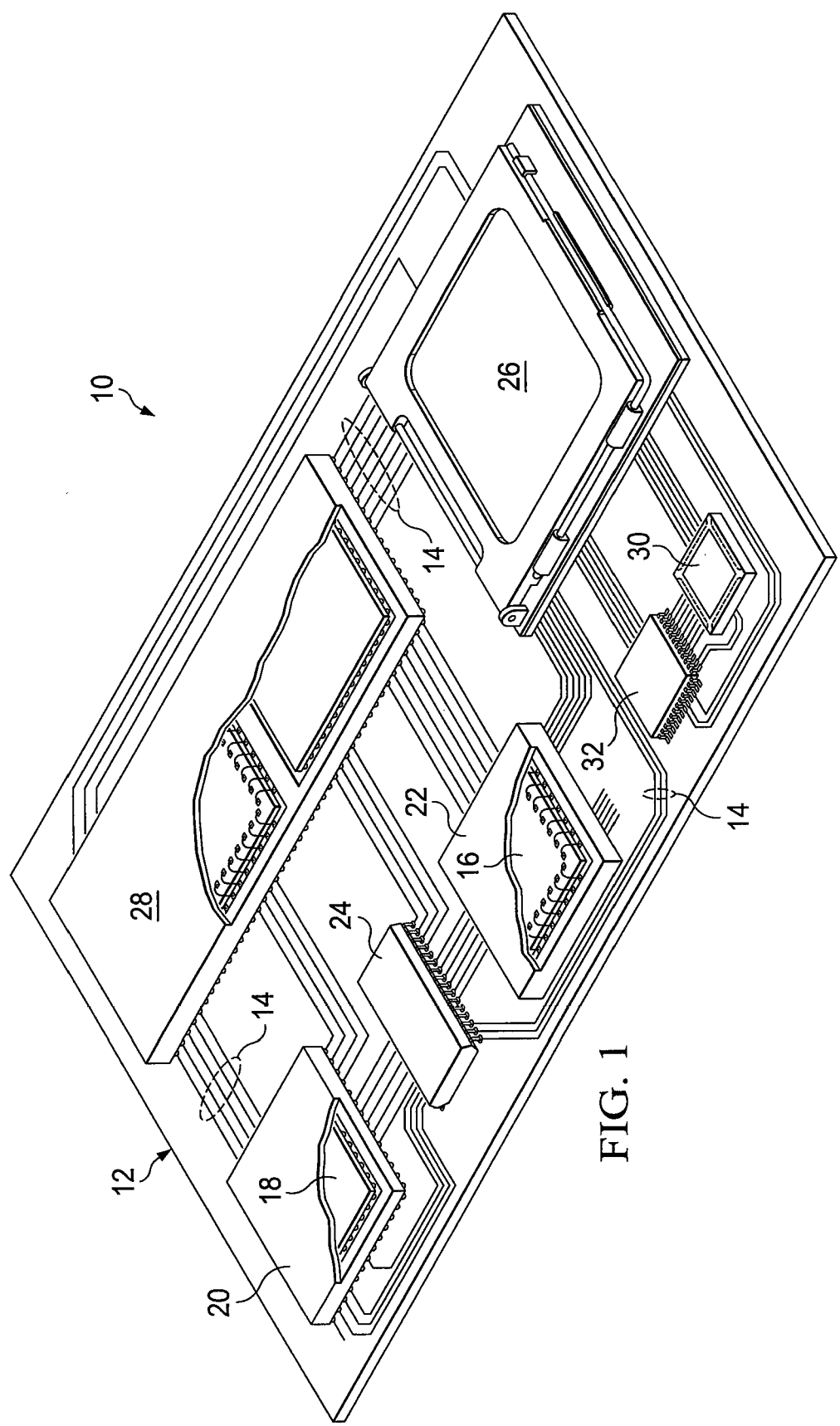
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is the technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a shorter manufacturing process. The resulting devices are less likely to fail and less expensive to manufacture resulting in lower costs for consumers.

Figure 2A:
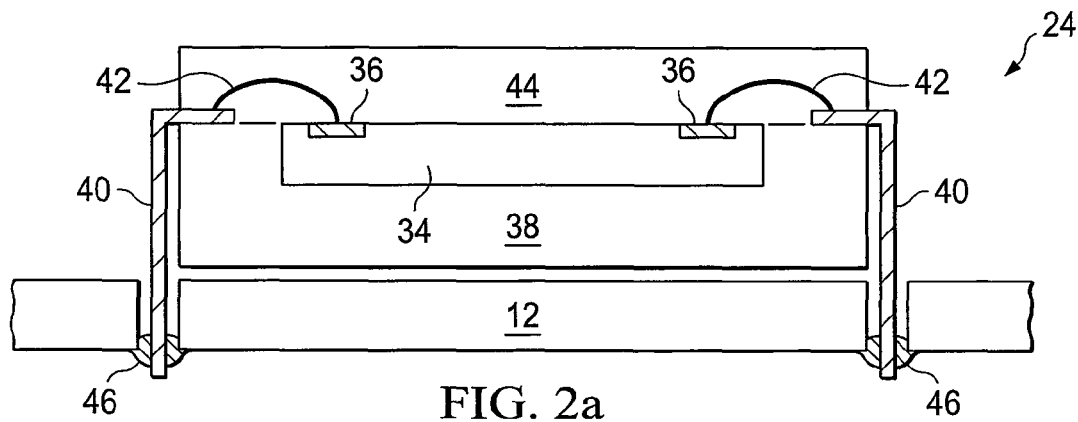
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active area containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active area of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as plastic or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
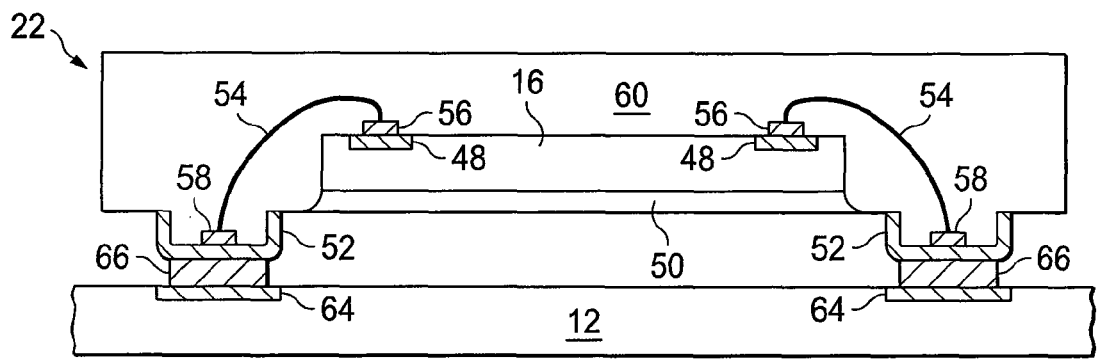

FIG. 2b illustrates further detail of BCC 22 mounted on PCB 12. Semiconductor die 16 is connected to a carrier by wire bond style first level packaging. BCC 22 is mounted to PCB 12 with a BCC style second level packaging. Semiconductor die 16 having contact pads 48 is mounted over a carrier using an underfill or epoxy-resin adhesive material 50. Semiconductor die 16 includes an active area containing analog or digital circuits implemented as active devices, passive devices, conductive layers, and dielectric layers formed within semiconductor die 16 and are electrically interconnected according to the electrical design of the die. For example, the circuit may include one or more transistors, diodes, inductors, capacitors, resistors, and other circuit elements formed within the active area of die 16. Contact pads 48 are made with a conductive material, such as Al, Cu, Sn, Ni, Au, or Ag, and are electrically connected to the circuit elements formed within die 16. Contact pads 48 are formed by PVD, CVD, electrolytic plating, or electroless plating process. Wire bonds 54 and bond pads 56 and 58 electrically connect contact pads 48 of semiconductor die 16 to contact pads 52 of BCC 22 forming the first level packaging. Molding compound or encapsulant 60 is deposited over semiconductor die 16, wire bonds 54, contact pads 48, and contact pads 52 to provide physical support and electrical isolation for the device. Contact pads 64 are formed on a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
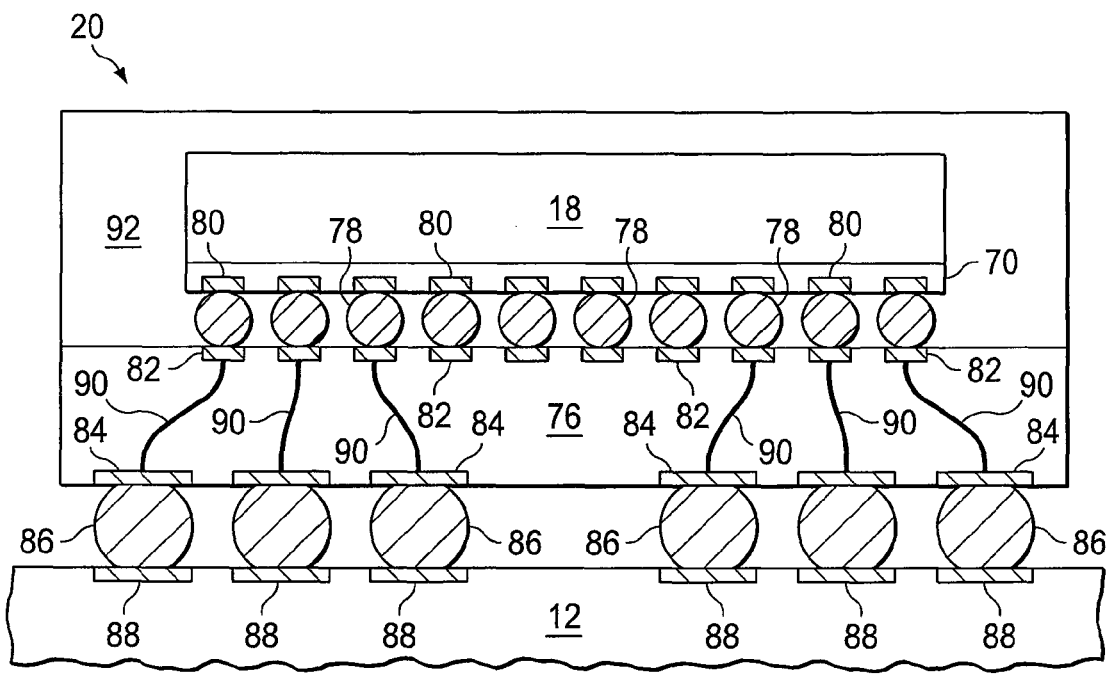

In FIG. 2c, semiconductor die 18 is mounted face down to carrier 76 with a flip chip style first level packaging. BGA 20 is attached to PCB 12 with a BGA style second level packaging. Active area 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active area 70 of semiconductor die 18. Semiconductor die 18 is electrically and mechanically attached to the carrier 76 through a large number of individual conductive solder bumps or balls 78. Solder bumps 78 are formed on bump pads or interconnect sites 80, which are disposed on active areas 70. Bump pads 80 are made with a conductive material, such as Al, Cu, Sn, Ni, Au, or Ag, and are electrically connected to the circuit elements formed in active area 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 90 routed through carrier 76. Contact pads 88 are formed on a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

Figure 3A:
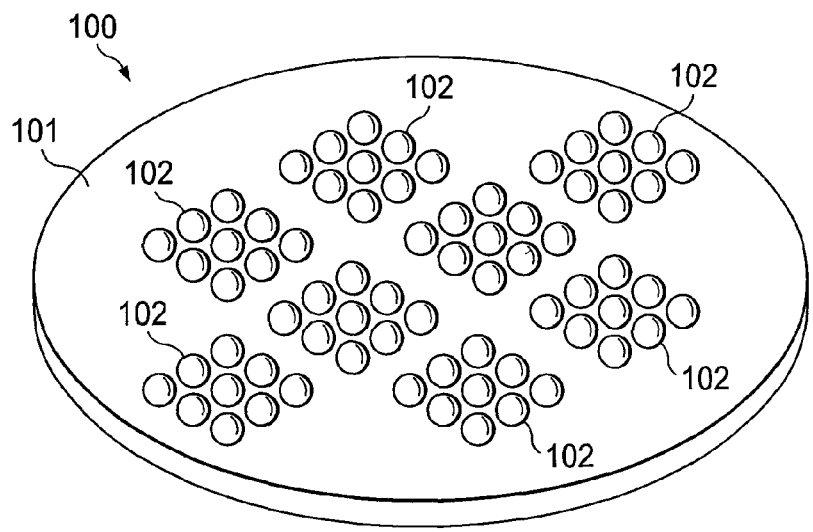
FIGS. 3a-3e illustrate a process of forming a stress relief layer on a backside of the wafer.

FIGS. 3a-3e illustrate a process of forming a stress relief layer on a backside of the semiconductor wafer to protect the die during the molding process. To start the process, a plurality of semiconductor die is formed on a semiconductor wafer 100 using the integrated circuit processes described above. FIG. 3a illustrates a semiconductor wafer 100 made with silicon, germanium, gallium arsenide, or other bulk semiconductor material. The semiconductor die each have active and passive devices, integrated passive devices (IPD), conductive layers, and dielectric layers formed on active surface 101 according to the electrical design of the die.

An electrically conductive solder material is deposited over contact pads on semiconductor wafer 100 using an evaporation, electrolytic plating, electroless plating, ball drop, or screen printing process. The solder material can be metal or electrically conductive material, e.g., Sn, Pb, Ni, Au, Ag, Cu, Bi, and alloys thereof. For example, the solder material can be eutectic Sn/Pb, high-lead, or lead-free. The solder material is reflowed by heating the material above its melting point to form solder bumps 102. In some applications, solder bumps 102 are reflowed a second time to improve electrical contact to the contact pads. Solder bumps 102 represent one type of interconnect structure that can be formed on semiconductor wafer 100.

Figure 3B:
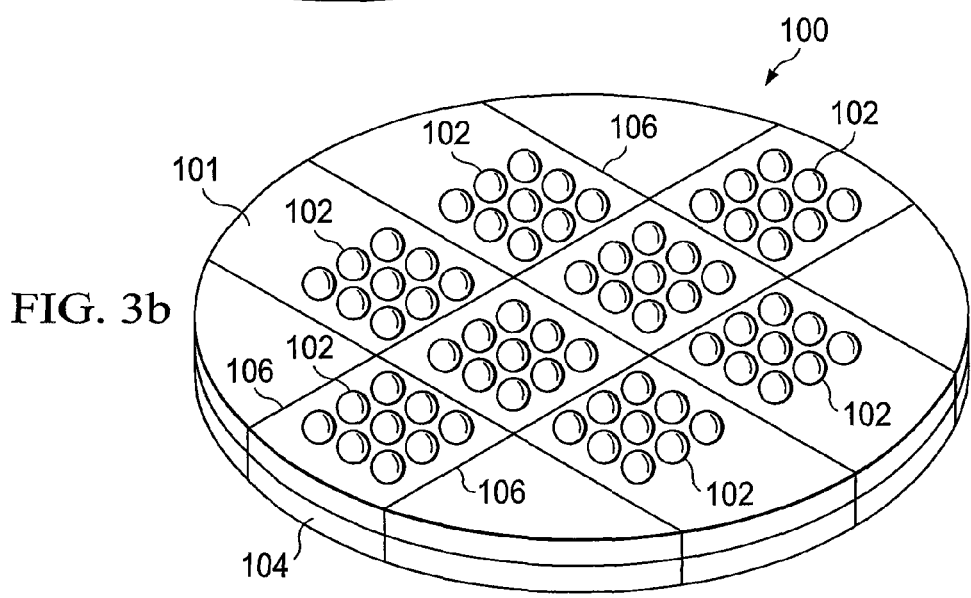

In FIG. 3b, a protective material 104 is deposited on a backside of wafer 100. The protective material 104 is characterized by the properties of low modulus, flexible, pliant, heat resistant to molding temperatures, e.g., 175° C., and dissolvable using a solvent without harming the package body. In one embodiment, protective material 104 can be adhesive paste, laminated film, spin-coated resin, epoxy based elastomer, organic rubbery material, polystyrene, polyethylene terephthalate (PET), or other polymer material. Protective layer 104 provides stress relief to protect the semiconductor die from cracking during a subsequent molding process.

Semiconductor wafer 100 is singulated along saw streets 106 into individual semiconductor die using a laser cutting tool or saw blade.

Figure 3C:
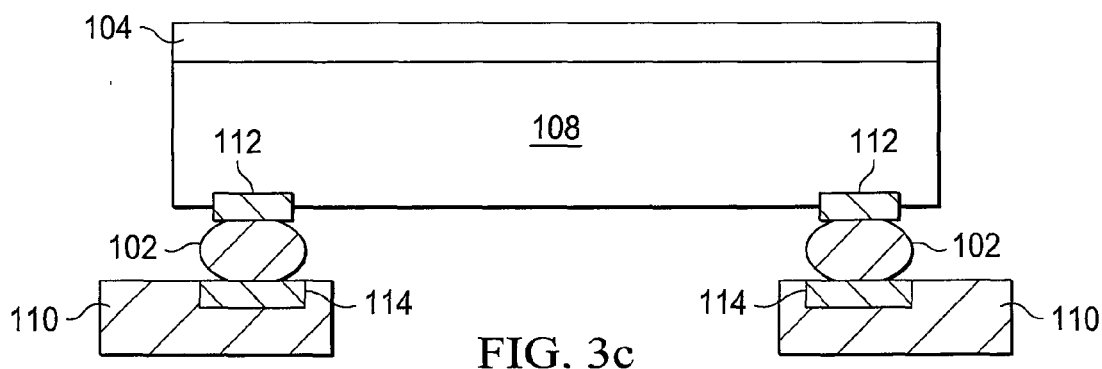

FIG. 3c shows one semiconductor die 108 with backside protective layer 104 mounted to chip carrier substrate 110. Solder bumps 102, which are formed on contact pads 112 on die 108, electrically and metallurgically connect to contact pads 114 on substrate 110. Contact pads 114 in turn electrically connect through signal traces within substrate 110 to external circuit components.

Figure 3D:
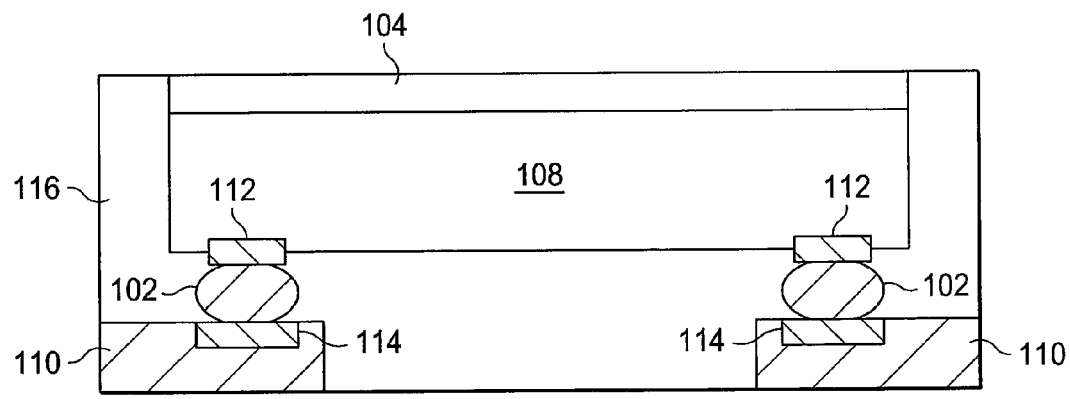

In FIG. 3d, an encapsulant or molding compound 116 is deposited over and around semiconductor die 108 using a printing, compressive molding, transfer molding, liquid encapsulant molding, or other suitable applicator. The die is placed in a mold injection cavity or chamber to form the molding compound around the die. Encapsulant 116 can be epoxy resin, epoxy acrylate, polymer, or polymer composite material. Encapsulant 116 is non-conductive and environmentally protects the semiconductor device from external elements and contaminants.

The molding process necessarily involves application of pressure to force the encapsulant material around the die. Accordingly, semiconductor die 108 is subject to stress as it is pressed against internal surfaces in the molding cavity. Protective layer 104 is formed on the backside of die 108 to protect the die from these stresses and potential cracking as it presses against the internal surfaces in the mold cavity, e.g., against the cavity ceiling. The compressive property of protective layer 104 reduces stress imposed on the backside of die 108 during the molding process.

Protective layer 104 also reduces bumps pad damage as the material complies with the mold cavity surface level, given a high degree of die tilt and inconsistent bump collapse height.

Figure 3E:
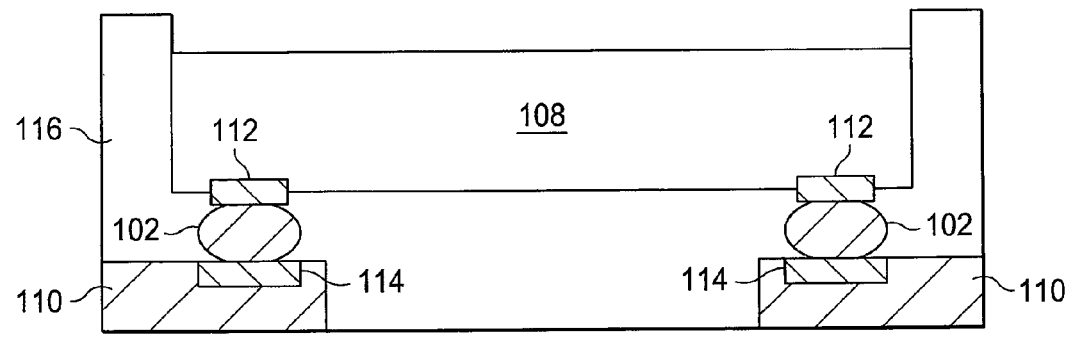

In FIG. 3e, protective layer 104 is removed from the backside of semiconductor die 108 using chemical etching, dissolving, or tape assisted peeling. The backside of semiconductor die 108 is exposed after removal of protective layer 104.

Figure 4A:
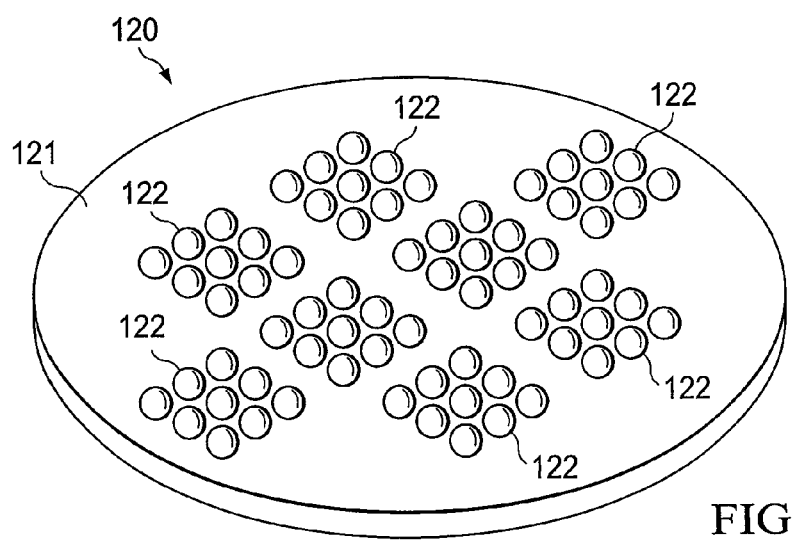
FIGS. 4a-4d illustrate a process of forming a thermal conductive layer on a backside of the wafer.

FIGS. 4a-4d illustrate a process of forming a thermal conductive layer on a backside of the semiconductor wafer. A plurality of semiconductor die is formed on a semiconductor wafer 120 using the integrated circuit processes described above. FIG. 4a illustrates a semiconductor wafer 120 made with silicon, germanium, gallium arsenide, or other bulk semiconductor material. The semiconductor die each have active and passive devices, IPDs, conductive layers, and dielectric layers formed on active surface 121 according to the electrical design of the die.

An electrically conductive solder material is deposited over contact pads on semiconductor wafer 120 using an evaporation, electrolytic plating, electroless plating, ball drop, or screen printing process. The solder material can be metal or electrically conductive material, e.g., Sn, Pb, Ni, Au, Ag, Cu, Bi, and alloys thereof. For example, the solder material can be eutectic Sn/Pb, high-lead, or lead-free. The solder material is reflowed by heating the material above its melting point to form solder bumps 122. In some applications, solder bumps 122 are reflowed a second time to improve electrical contact to the contact pads. Solder bumps 122 represent one type of interconnect structure that can be formed on semiconductor wafer.

Figure 4B:
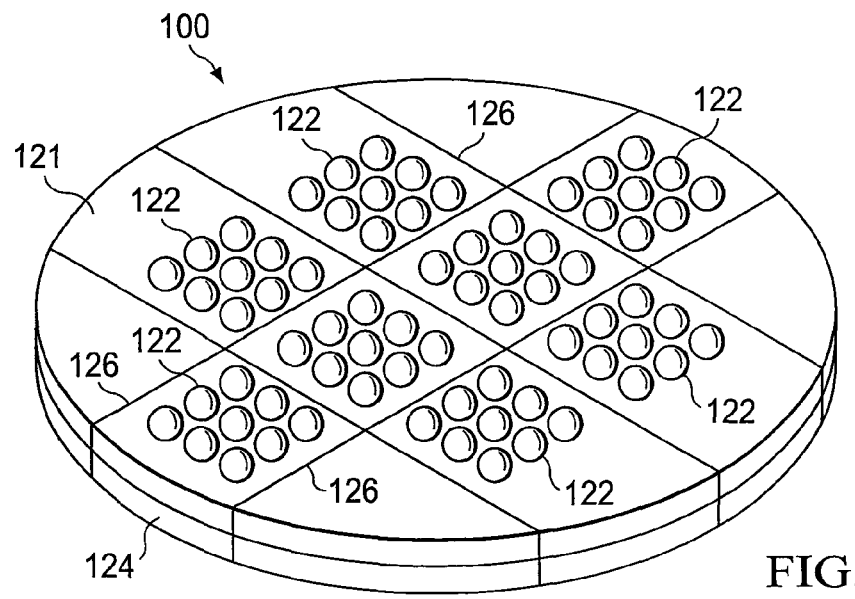

In FIG. 4b, a thermal interface material (TIM) 124 is deposited on a backside of wafer 120. TIM 124 is a protective layer for the semiconductor die. TIM 124 is characterized by the properties of high thermal conductivity and low thermal resistance. TIM 124 provides thermal dissipation of heat generated by the semiconductor die during normal operation. In one embodiment, TIM 124 can be metal or polymer-based material. TIM 124 typically includes a filler material such as alumina (Al2O3), zinc oxide (ZnO), silicon dioxide (SiO2), silver (Ag), aluminum (Al), and aluminum nitride (AlN). The concentration and type of filler material, as well as size, shape, and distribution of the filler particles in the polymer matrix, determine the thermal conductivity of TIM 124.

Semiconductor wafer 120 is singulated along saw streets 126 into individual semiconductor die using a laser cutting tool or saw blade.

Figure 4C:
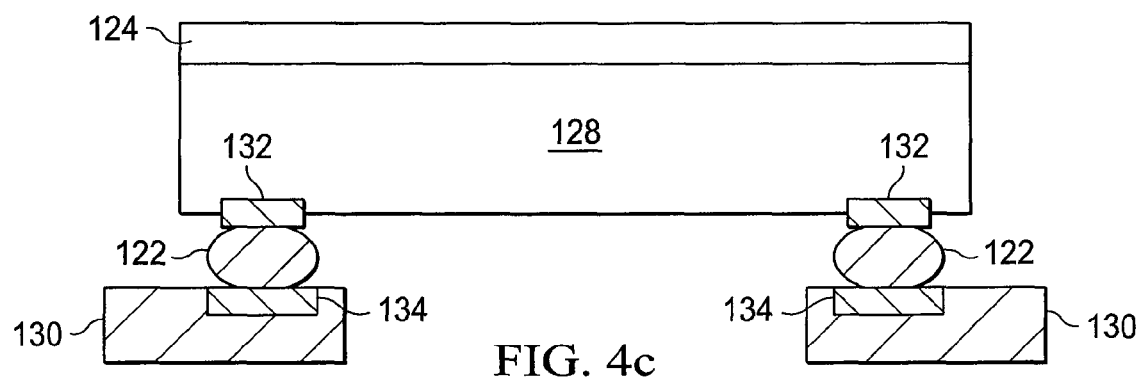

FIG. 4c shows semiconductor die 128 with backside TIM 124 mounted to chip carrier substrate 130. Solder bumps 122, which are formed on contact pads 132 on die 128, electrically and metallurgically connect to contact pads 134 on substrate 130. Contact pads 134 in turn electrically connect through signal traces within substrate 130 to external circuit components.

Figure 4D:
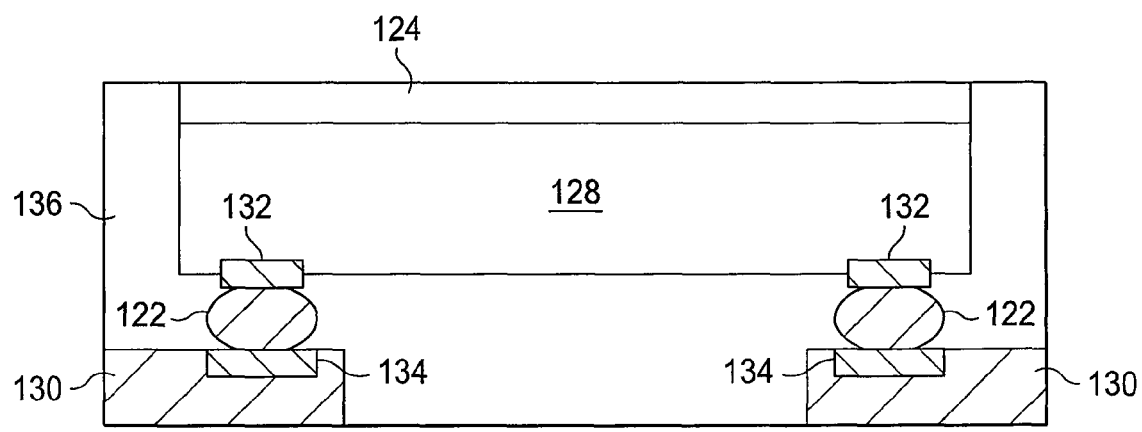

In FIG. 4d, an encapsulant or molding compound 136 is deposited over and around semiconductor die 128 using a printing, compressive molding, transfer molding, liquid encapsulant molding, or other suitable applicator. The die is placed in a mold injection cavity or chamber to form the molding compound around the die. Encapsulant 136 can be epoxy resin, epoxy acrylate, polymer, or polymer composite material. Encapsulant 136 is non-conductive and environmentally protects the semiconductor device from external elements and contaminants.

Depending on the selection of thermal conductive material, e.g., polymer-based materials, TIM 124 can provide stress relief for die 120. The molding process necessarily involves application of pressure to force the encapsulant material around the die. Accordingly, semiconductor die 108 is subject to stress as it is pressed against internal surfaces in the molding cavity. TIM 124 protects the die from these stresses and potential cracking as it presses against the internal surfaces in the mold cavity, e.g., against the cavity ceiling. The compressive property of TIM 124 reduces stress imposed on the backside of die 108 during the molding process.

TIM 124 can also reduce bumps pad damage as the material complies with the mold cavity surface level, given a high degree of die tilt and inconsistent bump collapse height.

Unlike protective layer 104, TIM 124 remains attached to semiconductor die 120 following the molding process. TIM 124 provides a thermal conduction path for dissipation of heat from semiconductor die 120 during normal operation.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising: providing a semiconductor wafer;
   forming a plurality of bumps on a first surface of the semiconductor wafer; forming a protective layer on an entire second surface of the semiconductor wafer opposite the first surface containing the bumps;
   singulating the semiconductor wafer into semiconductor die after forming the protective layer on the entire second surface of the semiconductor wafer so that the protective layer terminates at an edge of the second surface of the semiconductor die; mounting the semiconductor die to a carrier with the protective layer formed on the entire second surface oriented away from the carrier and the bumps oriented toward the carrier, the semiconductor die being separated from the carrier by the bumps;
   positioning the semiconductor die within a molding cavity;
   forming a molding compound around a side of the semiconductor die and around the bumps under pressure while the semiconductor die is within the molding cavity, wherein the protective layer reduces stress on the entire second surface of the semiconductor die during the molding process; and
   removing the entire protective layer from the semiconductor die after forming the molding compound around the semiconductor die and bumps leaving the entire second surface of the semiconductor die devoid of the molding compound for heat dissipation from the second surface of the semiconductor die.

2. The method of claim 1, wherein the protective layer includes a material selected from the group consisting of adhesive paste, laminated film, spin-coated resin, epoxy based elastomer, organic rubbery material, polystyrene, polyethylene terephthalate, or other polymer material.

3. The method of claim 1, wherein the protective layer includes a metal or polymer-based material.

4. The method of claim 1, wherein the protective layer includes a filler material selected from the group consisting of alumina, zinc oxide, silicon dioxide, silver, aluminum, and aluminum nitride.

5. A method of making a semiconductor device, comprising: providing a semiconductor wafer;
   forming an interconnect structure on a first surface of the semiconductor wafer;
   forming a protective layer on an entire second surface of the semiconductor wafer opposite the first surface containing the interconnect structure;
   singulating the semiconductor wafer into semiconductor die after forming the protective layer on the entire second surface of the semiconductor wafer so that the protective layer terminates at an edge of the second surface of the semiconductor die;
   disposing the semiconductor die within a pressurized cavity;
   forming a molding compound around a side of the semiconductor die and around the interconnect structure within the pressurized cavity, wherein the protective layer reduces stress on the entire second surface of the semiconductor die during the molding process; and
   removing the entire protective layer from the semiconductor die after forming the molding compound around the semiconductor die and interconnect structure leaving the entire second surface of the semiconductor die devoid of the molding compound for heat dissipation from the semiconductor die.

6. The method of claim 5, further including mounting the semiconductor die to a carrier prior to the step of forming the molding compound around the semiconductor die.

7. The method of claim 5, wherein the protective layer includes a material selected from the group consisting of adhesive paste, laminated film, spin-coated resin, epoxy based elastomer, organic rubbery material, polystyrene, polyethylene terephthalate, or other polymer material.

8. The method of claim 5, wherein the protective layer includes a metal or polymer-based material.

9. The method of claim 5, wherein the protective layer includes a filler material selected from the group consisting of alumina, zinc oxide, silicon dioxide, silver, aluminum, and aluminum nitride.

10. The method of claim 5, wherein the interconnect structure includes bumps.

11. A semiconductor device, comprising:
    a semiconductor die;
    an interconnect structure formed on a first surface of the semiconductor die;
    a protective layer formed on an entire second surface of the semiconductor die opposite the first surface containing the interconnect structure, the protective layer terminating at an edge of the second surface of the semiconductor die; and
    a molding compound formed around a side of the semiconductor die and around the interconnect structure, wherein the protective layer reduces stress on the entire second surface of the semiconductor die during the molding process, and the entire protective layer is removed from the semiconductor die after forming the molding compound around the semiconductor die and interconnect structure leaving the entire second surface of the semiconductor die devoid of the molding compound for heat dissipation.

12. The semiconductor device of claim 11, wherein the protective layer includes a material selected from the group consisting of adhesive paste, laminated film, spin-coated resin, epoxy based elastomer, organic rubbery material, polystyrene, polyethylene terephthalate, or other polymer material.

13. The semiconductor device of claim 11, wherein the protective layer includes a filler material selected from the group consisting of alumina, zinc oxide, silicon dioxide, silver, aluminum, and aluminum nitride.

14. A method of making a semiconductor device, comprising:
    providing a semiconductor die;
    forming an interconnect structure over a first surface of the semiconductor die;
    forming a protective layer over an entire second surface of the semiconductor die opposite the first surface so that the protective layer terminates at an edge of the second surface of the semiconductor die;

forming an encapsulant around a side of the semiconductor die and around the interconnect structure under pressure, wherein the protective layer reduces stress on the entire second surface of the semiconductor die during the encapsulation process; and removing the entire protective layer from the semiconductor die after forming the encapsulant around the semiconductor die and interconnect structure leaving the entire second surface of the semiconductor die devoid of the encapsulant for heat dissipation.

15. The method of claim 14, further including mounting the semiconductor die to a carrier prior to the step of forming the encapsulant around the semiconductor die.

16. The method of claim 14, wherein the protective layer includes a material selected from the group consisting of adhesive paste, laminated film, spin-coated resin, epoxy based elastomer, organic rubbery material, polystyrene, polyethylene terephthalate, or other polymer material.

17. The method of claim 14, wherein the protective layer includes a metal or polymer-based material.

18. The method of claim 14, wherein the protective layer includes a filler material selected from the group consisting of alumina, zinc oxide, silicon dioxide, silver, aluminum, and aluminum nitride.

19. The method of claim 14, wherein the interconnect structure includes a bump.

20. A method of making a semiconductor device, comprising: providing a semiconductor die;
forming an interconnect structure over a first surface of the semiconductor die;
forming a protective layer over an entire second surface of the semiconductor die opposite the first surface so that the protective layer terminates at an edge of the second surface of the semiconductor die; and
forming an encapsulant around a side of the semiconductor die and around the interconnect structure under pressure, wherein the protective layer reduces stress on the entire second surface of the semiconductor die during the encapsulation process; and
removing the protective layer for heat dissipation from the second surface of the semiconductor die.

21. The method of claim 20, further including removing the entire protective layer from the semiconductor die after forming the encapsulant around the semiconductor die and interconnect structure leaving the entire second surface of the semiconductor die devoid of the encapsulant.

22. The method of claim 20, further including mounting the semiconductor die to a carrier prior to the step of forming the encapsulant around the semiconductor die.

23. The method of claim 20, wherein the protective layer includes a material selected from the group consisting of adhesive paste, laminated film, spin-coated resin, epoxy based elastomer, organic rubbery material, polystyrene, polyethylene terephthalate, or other polymer material.

24. The method of claim 20, wherein the protective layer includes a metal or polymer-based material.

25. The method of claim 20, wherein the protective layer includes a filler material selected from the group consisting of alumina, zinc oxide, silicon dioxide, silver, aluminum, and aluminum nitride.

26. The method of claim 20, wherein the interconnect structure includes a bump.

27. The method of claim 20, wherein the protective layer provides a thermal dissipation.

28. A method of making a semiconductor device, comprising:
providing a semiconductor die;
forming a protective layer over a first surface of the semiconductor die;
forming an encapsulant around the semiconductor die under pressure, wherein the protective layer protects the semiconductor die from stress and cracking; and
removing at least a portion of the protective layer from the semiconductor die for heat dissipation.

29. The method of claim 28, further including forming an interconnect structure on a second surface of the semiconductor die opposite the first surface of the semiconductor die.

30. The method of claim 29, further including forming the encapsulant around the interconnect structure.

31. The method of claim 28, further including forming the encapsulant within a molding cavity.

32. The method of claim 28, wherein the protective layer protects the entire first surface of the semiconductor die from stress and cracking.

33. The method of claim 28, wherein the protective layer includes a thermally conductive material.

* * * * *